US011854752B2

United States Patent
Matsuo et al.

(10) Patent No.: US 11,854,752 B2
(45) Date of Patent: Dec. 26, 2023

(54) RELAY STATE PREDICTION DEVICE, RELAY STATE PREDICTION SYSTEM, RELAY STATE PREDICTION METHOD, AND NON-TRANSITORY COMPUTER READABLE MEDIUM

(71) Applicant: OMRON Corporation, Kyoto (JP)

(72) Inventors: Shinya Matsuo, Yamaga (JP); Takuya Yamazaki, Kyoto (JP)

(73) Assignee: OMRON CORPORATION, Kyoto (JP)

(*) Notice: Subject to any disclaimer, the term of this patent is extended or adjusted under 35 U.S.C. 154(b) by 374 days.

(21) Appl. No.: 17/340,563

(22) Filed: Jun. 7, 2021

(65) Prior Publication Data
US 2021/0296058 A1   Sep. 23, 2021

Related U.S. Application Data

(63) Continuation of application No. PCT/JP2019/045186, filed on Nov. 19, 2019.

(30) Foreign Application Priority Data

Dec. 28, 2018   (JP) ................... 2018-246736

(51) Int. Cl.
*H01H 1/00* (2006.01)
*H01H 51/06* (2006.01)
*H01H 71/04* (2006.01)

(52) U.S. Cl.
CPC .......... *H01H 1/0015* (2013.01); *H01H 51/06* (2013.01); *H01H 71/04* (2013.01); *H01H 2071/044* (2013.01)

(58) Field of Classification Search
CPC ...... H01H 1/0015; H01H 51/06; H01H 71/04; H01H 2071/044; H01H 47/002; G01R 31/3278
See application file for complete search history.

(56) References Cited

U.S. PATENT DOCUMENTS 5,742,624 A * 4/1998 Irie ............... G05B 19/058
                                              714/799
6,556,406 B1 * 4/2003 Matsunaga ......... H03K 17/79
                                              361/100

(Continued)

FOREIGN PATENT DOCUMENTS

JP    2005513729 A    5/2005
JP    2013089603 A    5/2013

(Continued)

OTHER PUBLICATIONS

International Search Report for International Application No. PCT/JP2019/045186; dated Jan. 7, 2020.

(Continued)

*Primary Examiner* — Alvaro E Fortich
(74) *Attorney, Agent, or Firm* — CANTOR COLBURN LLP

(57) ABSTRACT

A relay state prediction device according to the present invention includes: a voltage value acquisition unit that measures every moment a detected voltage detected from two ends of a shunt resistor; a voltage value difference calculation unit that calculates a voltage value difference between a first voltage value of when the detected voltage becomes minimum by an armature starting displacement after a primary-side switch is turned off and a second voltage value of when secondary-side contacts are opened; a slope calculation unit that calculates a slope at which the voltage value difference decreases as the secondary-side contacts are repeatedly opened and closed in response to the primary-side switch repeatedly turning on and off; and a state prediction unit that predicts the number of openable and closable times from the present time until the voltage value difference reaches a predetermined threshold value based on (Continued)

the voltage value difference at the present time and the decreasing slope.

6 Claims, 6 Drawing Sheets

(56) References Cited

U.S. PATENT DOCUMENTS

| | | |
|---|---|---|
| 2005/0122117 A1 | 6/2005 | Baurand et al. |
| 2007/0222427 A1 | 9/2007 | Takeuchi et al. |
| 2009/0138212 A1 | 5/2009 | Maruyama |
| 2013/0103334 A1 | 4/2013 | Delbaere et al. |
| 2015/0055269 A1* | 2/2015 | Kim .................. H01H 47/22 361/170 |
| 2016/0358732 A1* | 12/2016 | Nishio ............... G01R 31/3278 |
| 2018/0267680 A1* | 9/2018 | Takahashi ........ G05B 19/41835 |

FOREIGN PATENT DOCUMENTS

| | | | |
|---|---|---|---|
| WO | 2005111641 A1 | 11/2005 | |
| WO | 2007108063 A1 | 9/2007 | |

OTHER PUBLICATIONS

PCT Written Opinion of the International Searching Authority for International Application No. PCT/JP2019/045186; dated Jan. 7, 2020.

\* cited by examiner

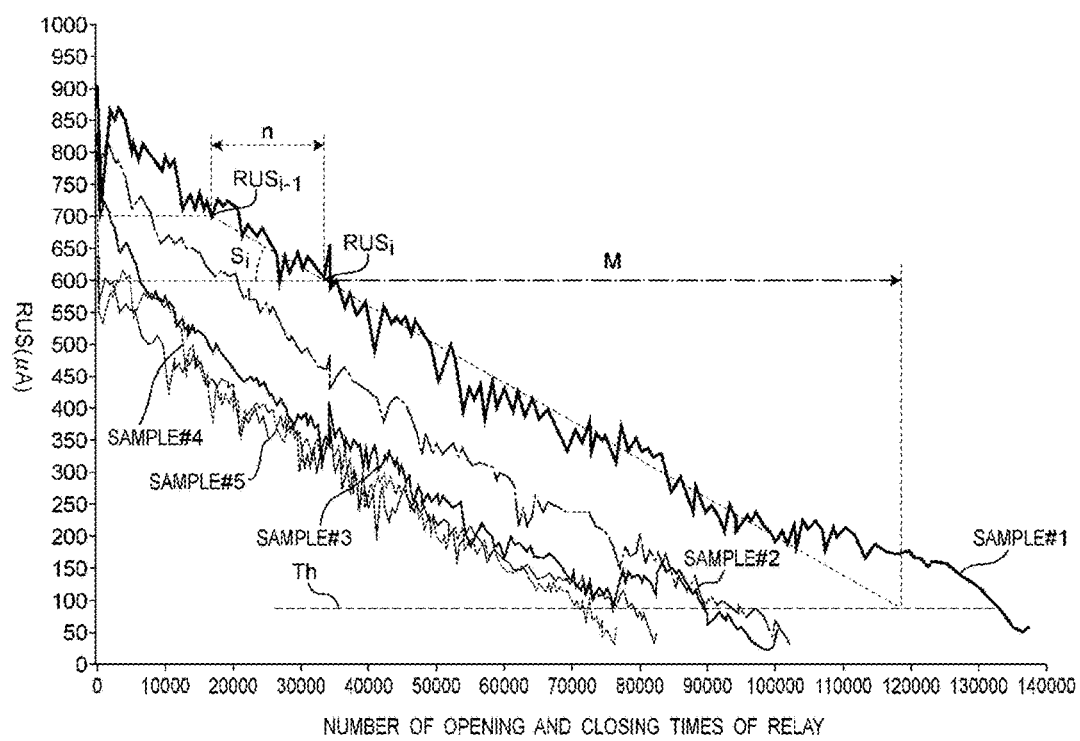

RELAY STATE PREDICTION DEVICE, RELAY STATE PREDICTION SYSTEM, RELAY STATE PREDICTION METHOD, AND NON-TRANSITORY COMPUTER READABLE MEDIUM

CROSS-REFERENCE TO RELATED APPLICATION

This is a continuation application of International Application No. PCT/JP2019/045186, with an International filing date of Nov. 19, 2019, which claims priority of Japanese Patent Application No. 2018-246736 filed on Dec. 28, 2018, the entire content of which is hereby incorporated by reference.

TECHNICAL FIELD

The present invention relates to a relay state prediction device, a relay state prediction system, a relay state prediction method, and a non-transitory computer readable medium, and relates to, for example, a relay state prediction device, a relay state prediction system, a relay state prediction method, and a non-transitory computer readable medium which can predict the number of openable and closable times until the deterioration of a relay of a type that opens and closes a contact on a secondary side by turning on and off energization to a coil on a primary side.

BACKGROUND ART

Conventionally, as this type of relay state prediction device, for example, as disclosed in JP 2013-89603 A, there is known a device that measures a maximum value of current flowing through an operation coil (actuating coil) on the primary side provided in a relay when the relay is turned off, and predicts that the relay has deteriorated when the maximum value falls below a predetermined threshold value.

SUMMARY OF THE INVENTION

However, Patent Document 1 (JP 2013-89603 A) does not disclose on predicting the number of openable and closable times until the deterioration, that is, the remaining life, of the relay.

Therefore, an object of the present invention is to provide a relay state prediction device, a relay state prediction system, a relay state prediction method, and a program which can predict the remaining life of a relay.

In order to solve the above-mentioned problem, a relay state prediction device of the present disclosure that predicts a number of openable and closable times until deterioration of a relay, the relay includes:
a primary-side switch, an operation coil, and a shunt resistor that are connected in series to a primary-side power supply;
a diode connected in parallel to a series connection of the operation coil and the shunt resistor in a direction in which current due to a counter electromotive force of the operation coil flows to the shunt resistor when the primary-side switch is turned off; and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount, the relay state prediction device comprises:
a voltage value acquisition unit that measures every moment a detected voltage detected from two ends of the shunt resistor;
a voltage value difference calculation unit that calculates a voltage value difference between a first voltage value of when the detected voltage becomes minimum by the armature starting displacement after the primary-side switch is turned off and a second voltage value of when the secondary-side contacts are opened;
a slope calculation unit that calculates a slope at which the voltage value difference decreases as the secondary-side contacts are repeatedly opened and closed in response to the primary-side switch repeatedly turning on and off; and
a state prediction unit that predicts the number of openable and closable times from a present time until the voltage value difference reaches a predetermined threshold value based on the voltage value difference at the present time and the slope that decreases.

In another aspect, a relay state prediction system of the present disclosure comprises:
a relay that includes
a primary-side switch, an operation coil, and a shunt resistor that are connected in series to a primary-side power supply,
a diode connected in parallel to a series connection of the operation coil and the shunt resistor in a direction in which current due to a counter electromotive force of the operation coil flows to the shunt resistor when the primary-side switch is turned off, and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount;
a first voltmeter that measures a detected voltage detected from two ends of the shunt resistor;
a second voltmeter that measures a voltage between the pair of secondary-side contacts of the relay; and
a relay state prediction device communicably connected to the first voltmeter and the second voltmeter,
wherein the relay state prediction device includes:
a voltage value acquisition unit that measures every moment a detected voltage detected from the two ends of the shunt resistor;
a voltage value difference calculation unit that calculates a voltage value difference between a first voltage value of when the detected voltage becomes minimum by the armature starting displacement after the primary-side switch is turned off and a second voltage value of when the secondary-side contacts are opened;
a slope calculation unit that calculates a slope at which the voltage value difference decreases as the secondary-side contacts are repeatedly opened and closed in response to the primary-side switch repeatedly turning on and off; and
a state prediction unit that predicts a number of openable and closable times from a present time until the voltage value difference reaches a predetermined threshold value based on the voltage value difference at the present time and the slope that decreases.

In another aspect, a relay state prediction method of the present disclosure that predicts a number of openable and closable times until deterioration of a relay includes:
a primary-side switch, an operation coil, and a shunt resistor that are connected in series to a primary-side power supply;
a diode connected in parallel to a series connection of the operation coil and the shunt resistor in a direction in which current due to a counter electromotive force of the operation coil flows to the shunt resistor when the primary-side switch is turned off; and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount,
the relay state prediction method comprises:
measuring every moment a detected voltage detected from two ends of the shunt resistor;
calculating a voltage value difference between a first voltage value of when the detected voltage becomes minimum by the armature starting displacement after the primary-side switch is turned off and a second voltage value of when the secondary-side contacts are opened;
calculating a slope at which the voltage value difference decreases as the secondary-side contacts are repeatedly opened and closed in response to the primary-side switch repeatedly turning on and off; and
predicting the number of openable and closable times from a present time until the voltage value difference reaches a predetermined threshold value based on the voltage value difference at the present time and the slope that decreases.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a diagram showing a relationship between the RUS of the relay and the number of opening and closing times of the relay, for each of a plurality of samples.

DESCRIPTION OF EMBODIMENTS

Hereinafter, an embodiment of the present disclosure is described in detail with reference to the drawings.

(Schematic Configuration of Relay State Prediction System 100)

Figure 1:
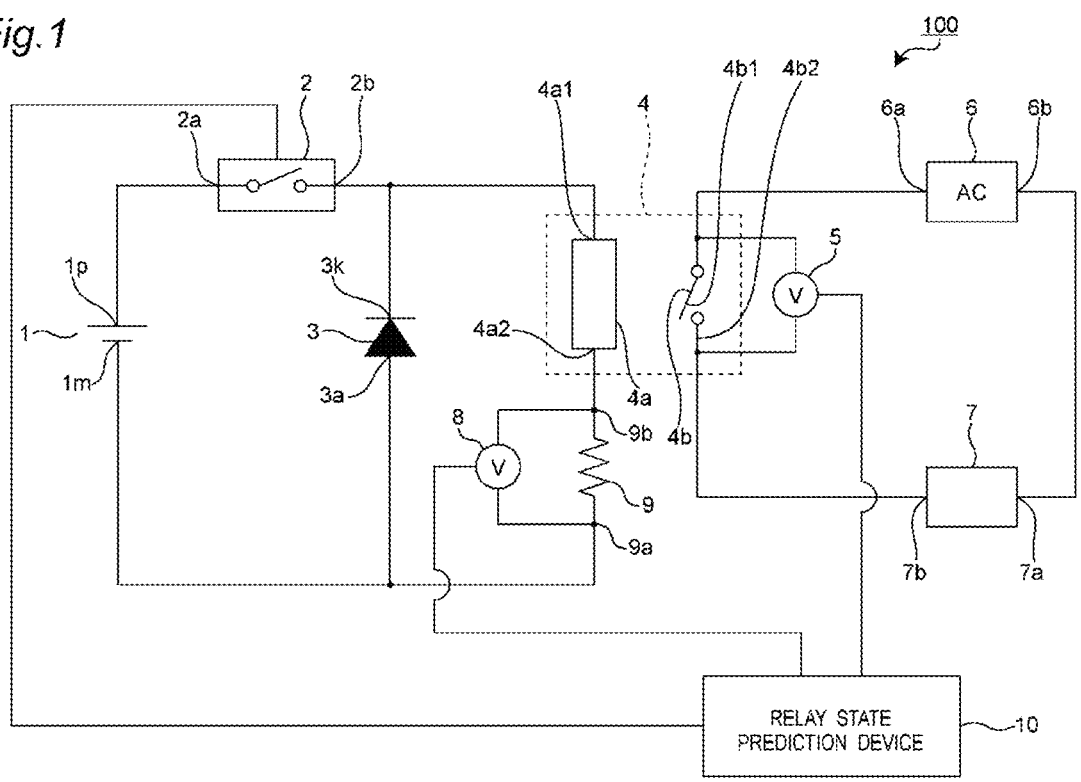
FIG. 1 is a diagram showing a schematic configuration of a relay state prediction system according to an embodiment.

FIG. 1 shows an overall configuration of a relay state prediction system 100. As an example, the relay state prediction system 100 predicts the remaining life of a relay 4. Here, the "remaining life" of the relay 4 refers to the number of openable and closable times from the present time until the voltage value difference (or RUS) reaches a predetermined threshold value.

As shown in FIG. 1, a relay state prediction system 100 includes the relay 4, voltmeters 5 and 8, and a relay state prediction device 10. The relay state prediction system 100 further includes a direct current (DC) power supply 1, a switch device 2, a diode 3, a shunt resistor 9, an alternating current (AC) power supply 6, and a load 7.

As shown in FIG. 1, the relay 4 is arranged across a primary-side circuit and a secondary-side circuit. The relay 4 includes an operation coil 4a on a primary side and a switch 4b on a secondary side. In addition, the switch 4b on the secondary side has a pair of contacts (a first contact 4b1 and a second contact 4b2) in this example. The pair of contacts 4b1 and 4b2 are opened and closed by turning on and off the energization to the operation coil 4a on the primary side.

As shown in FIG. 1, in the primary-side circuit, a positive electrode terminal 1p of the DC power supply 1 is connected to a one end 2a of the switch device 2. An other end 2b of the switch device 2 is connected to a cathode terminal 3k of the diode 3. The other end 2b of the switch device 2 is connected to a one end 4a1 of the operation coil 4a. A negative electrode terminal 1m of the DC power supply 1 is connected to an anode terminal 3a of the diode 3. The negative electrode terminal 1m of the DC power supply 1 is connected to a one end 9a of the shunt resistor 9. An other end 9b of the shunt resistor is connected to an other end 4a2 of the operation coil 4a. The voltmeter 8 is connected in parallel to the shunt resistor 9. As a result, the voltmeter 8 can measure a voltage value between the two ends 9a and 9b of the shunt resistor 9.

As shown in FIG. 1, in the secondary-side circuit, the first contact 4b1 of the switch 4b is connected to a one end 6a of the AC power supply 6 being a load power supply. An other end 6b of the AC power supply 6 is connected to a one end 7a of the load 7. An other end 7b of the load 7 is connected to the second contact 4b2 of the switch 4b. The voltmeter 5 is connected in parallel to the switch 4b. Thus, the voltmeter 5 can measure a voltage value between the pair of contacts 4b1 and 4b2 of the relay 4.

The relay state prediction device 10 is arranged separately from the primary-side circuit and the secondary-side circuit described above. As illustrated in FIG. 1, the relay state prediction device 10 is communicably connected to the voltmeters 5 and 8. The connection between the relay state prediction device 10 and the voltmeters 5 and 8 may be wired or wireless. With this configuration, the relay state prediction device 10 can receive voltage values, which are the measurement results of the voltmeters 5 and 8, from the voltmeters 5 and 8. The relay state prediction device 10 is communicably connected to the switch device 2. The connection between the relay state prediction device 10 and the switch device 2 may be wired or wireless. With this configuration, the switch device 2 can notify the relay state prediction device 10 of the off timing of the switch device 2.

The DC power supply 1 supplies a direct current to the operation coil 4a in the relay 4. In this example, the switch device 2 is composed of a field effect transistor (FET), and is switched from an ON state to an OFF state or from the OFF state to the ON state according to a switch control signal from the outside (not illustrated). The switch device 2 transmits a signal indicating the switching timing to the relay state prediction device 10. The switch device 2 may be composed of a semiconductor switch other than the FET or a mechanical switch. The diode 3 is arranged to protect the circuit from a counter electromotive voltage generated by the operation coil 4*a* being an inductive load.

As described above, in the relay 4, the pair of contacts 4*b*1 and 4*b*2 on the secondary side is opened and closed by turning on and off the energization to the operation coil 4*a* on the primary side. More specifically, when the switch device 2 is switched on, the energization from the DC power supply 1 to the operation coil 4*a* is turned on. When the operation coil 4*a* is energized, the relay 4 (more specifically, the switch 4*b*) is closed. On the other hand, when the switch device 2 is switched off, the energization from the DC power supply 1 to the operation coil 4*a* is turned off. When the operation coil 4*a* is de-energized, the relay 4 (more specifically, the switch 4*b*) is opened.

The switch 4*b* in the relay 4 has the first contact 4*b*1 and the second contact 4*b*2. The voltmeter 5 measures the voltage value between the first contact 4*b*1 and the second contact 4*b*2. The voltmeter 5 transmits the measured voltage value as a signal to the relay state prediction device 10. The AC power supply 6 supplies AC power to the load 7. Then, the load 7 consumes the supplied AC power and performs a predetermined operation.

(Operation of Relay)

Figure 4A:
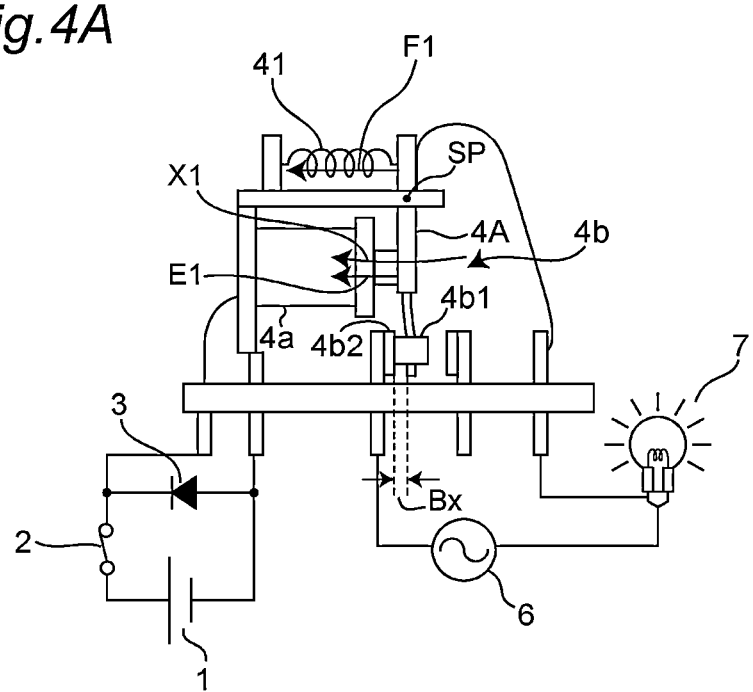
FIG. 4A is a diagram showing a state in which a switch on a secondary side of the relay is "closed".

FIG. 4A illustrates a state in which the switch device 2 is turned on and the switch 4*b* of the relay 4 is "closed". In this state, an armature 4A of the switch 4*b* is displaced relative to the operation coil 4*a* by electromagnetic force E1 generated by the operation coil 4*a*. Specifically, the armature 4A rotates in a direction indicated by an arrow X1 around a supporting point SP against tensile force F1 of a coil spring 41, and brings the first contact 4*b*1 into contact with the second contact 4*b*2 while bending by a certain push-in amount Bx.

Figure 4B:
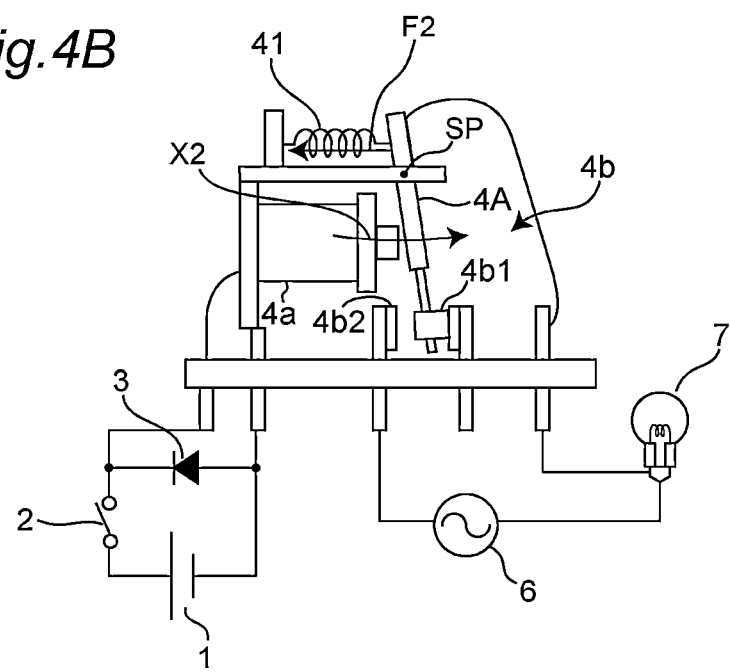
FIG. 4B is a diagram showing a state in which the switch on the secondary side of the relay is "opened".

FIG. 4B illustrates a state in which the switch device 2 is turned off and the switch 4*b* of the relay 4 is "opened". In this state, the electromagnetic force E1 generated by the operation coil 4*a* decreases, and as a result, the armature 4A of the switch 4*b* rotates in a direction indicated by an arrow X2 around the supporting point SP by tensile force F2 of the coil spring 41. As a result, the pressure pressing the first contact 4*b*1 changes from a certain value to zero, and the first contact 4*b*1 is separated from the second contact 4*b*2. In this case, a counter electromotive voltage is generated in the operation coil 4*a*, and current flowing through the operation coil 4*a* flows back through the diode 3.

(Schematic Configuration of Relay State Prediction Device 10)

Figure 2:
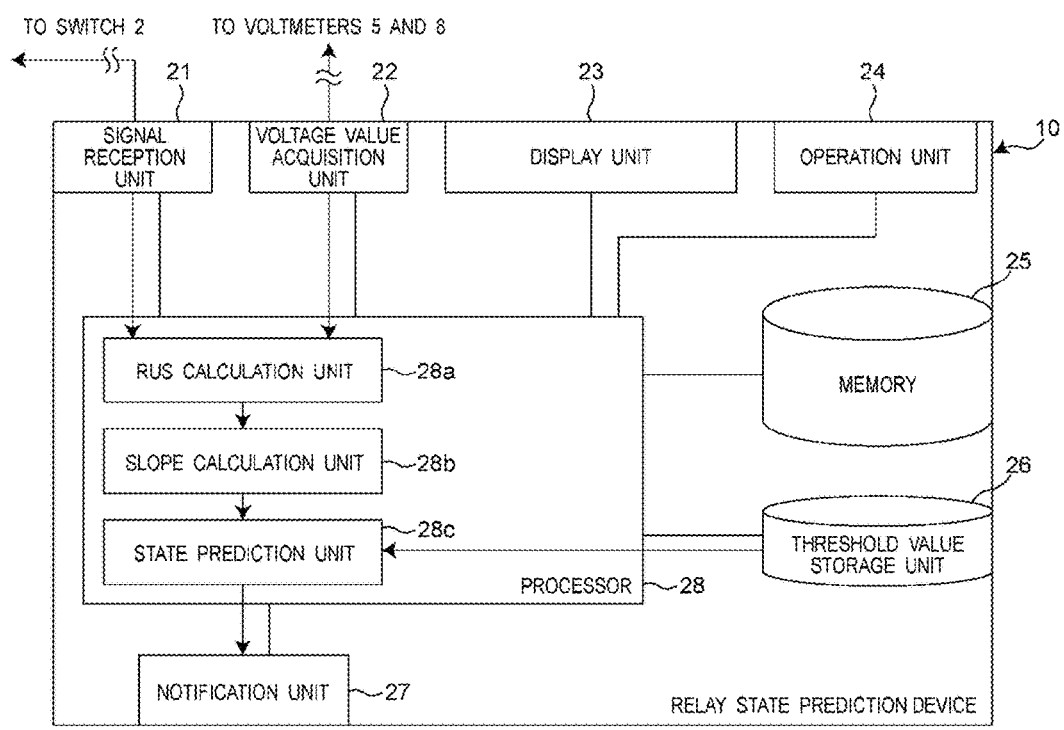
FIG. 2 is a diagram showing a block configuration of a relay state prediction device included in the relay state prediction system in FIG. 1.

Next, a configuration of the relay state prediction device 10 is described. FIG. 2 illustrates a schematic configuration of the relay state prediction device 10. In the present embodiment, the relay state prediction device 10 predicts the remaining life of the relay 4 described above. As illustrated in FIG. 2, the relay state prediction device 10 includes a signal reception unit 21, a voltage value acquisition unit 22, a display unit 23, an operation unit 24, a memory 25, a threshold value storage unit 26, a notification unit 27, and a processor 28.

In the relay state prediction device 10, the processor 28 is communicably connected to the signal reception unit 21, the voltage value acquisition unit 22, the display unit 23, the operation unit 24, the memory 25, the threshold value storage unit 26, and the notification unit 27. With this configuration, the processor 28 controls the signal reception unit 21, the voltage value acquisition unit 22, the display unit 23, the operation unit 24, the memory 25, the threshold value storage unit 26, and the notification unit 27, and the respective units 21, 22, 23, 24, 25, 26, and 27 perform predetermined operations by the control.

The signal reception unit 21 transmits and receives a signal or data to and from an external terminal. For example, the signal reception unit 21 according to the present embodiment is communicably connected to the switch device 2. Therefore, the signal reception unit 21 receives, from the switch device 2, data indicating the timing at which the switch device 2 is turned to the OFF state, and the like.

The voltage value acquisition unit 22 transmits and receives a signal or data to and from the external terminal. For example, the voltage value acquisition unit 22 according to the present embodiment is communicably connected to the voltmeters 5 and 8. Therefore, the voltage value acquisition unit 22 receives (acquires) signals indicating the voltage values measured by the voltmeters 5 and 8 from the voltmeters 5 and 8.

The display unit 23 is a monitor that displays various images. The display unit 23 can visually display results of various types of analysis and the like performed in the processor 28. In addition, the display unit 23 can also visibly display predetermined information in response to an instruction from the user via the operation unit 24. For example, the display unit 23 may visibly display the information (data) stored in the memory 25 and the threshold value storage unit 26. Furthermore, the display unit 23 may visibly display a predetermined notification and the like. For example, a liquid crystal monitor or the like can be adopted as the display unit 23.

The operation unit (which can be understood as a threshold value input unit) 24 is a portion that receives a predetermined operation (instruction) from the user. For example, the operation unit 24 is constituted of a mouse, a keyboard, and others. Note that in the case in which a touch panel monitor is employed as the display unit 23, the display unit 23 has not only a display function but also a function as the operation unit 24.

The memory 25 stores various types of data. The memory 25 includes a random access memory (RAM), a read only memory (ROM), and others. For example, various programs used for such as the operation of the processor 28 are changeably stored in the memory 25. In addition, the memory 25 stores data (data indicating the switching timing) from the switch device 2 acquired by the signal reception unit 21, voltage value data from the voltmeters 5 and 8 acquired by the voltage value acquisition unit 22, and so on. The memory 25 may erase various types of stored data after a preset predetermined time period elapses after the storage.

The threshold value storage unit 26 stores a threshold value Th for predicting whether or not the relay 4 has deteriorated. Here, the threshold value Th is determined (set) by the user based on such as an empirical rule. The threshold value Th stored in the threshold value storage unit 26 can be changed. For example, the operation unit 24 functions as the threshold value input unit for variably inputting the threshold value Th. The user inputs a desired threshold value Th to the operation unit 24. By this, the threshold value Th is stored (set) in the threshold value storage unit 26. Note that, in the case in which a threshold value Th' is already stored in the threshold value storage unit 26, the threshold value Th' is changed to the threshold value Th corresponding to the operation by the operation from the user via the operation unit 24. Note that the threshold value storage unit 26 may have a predetermined threshold value Th as a default.

The notification unit 27 notifies of the remaining life of the relay 4 based on an analysis result of the processor 28 described later. For example, the notification unit 27 is constituted of a liquid crystal display device. In this example, the notification unit 27 displays the remaining number of openable and closable times of the relay 4 in a digital or analog manner. The display unit 23 can have the function of the notification unit 27, and in this case, predetermined information (information indicating the remaining life of the relay 4) is displayed on the display unit 23 in a visually recognizable manner.

The processor 28 includes a central processing unit (CPU) in this example. For example, the processor 28 reads each program and each piece of data stored in the memory 25. In addition, the processor 28 controls each of the units 21 to 27 according to the read program to execute a predetermined operation (function). In addition, the processor 28 performs predetermined calculation, analysis, processing, and others in the processor 28 (blocks 28a and 28c configured by programs) according to the read program. Note that some or all of the functions executed by the processor 28 may be configured as hardware by one or a plurality of integrated circuits or the like.

As illustrated in FIG. 2, the processor 28 according to the present embodiment includes, as functional blocks, an RUS calculation unit 28a, a slope calculation unit 28b, and a state prediction unit 28c programmed to realize predetermined operations. Note that the operation of each of the blocks 28a, 28b, and 28c is described in detail in the description of the operation to be described later.

(Operation of Relay State Prediction System 100)

Next, the operation of the relay state prediction system 100 to predict the remaining life of the relay 4 is described with reference to a flowchart shown in FIG. 3.

Figure 3:
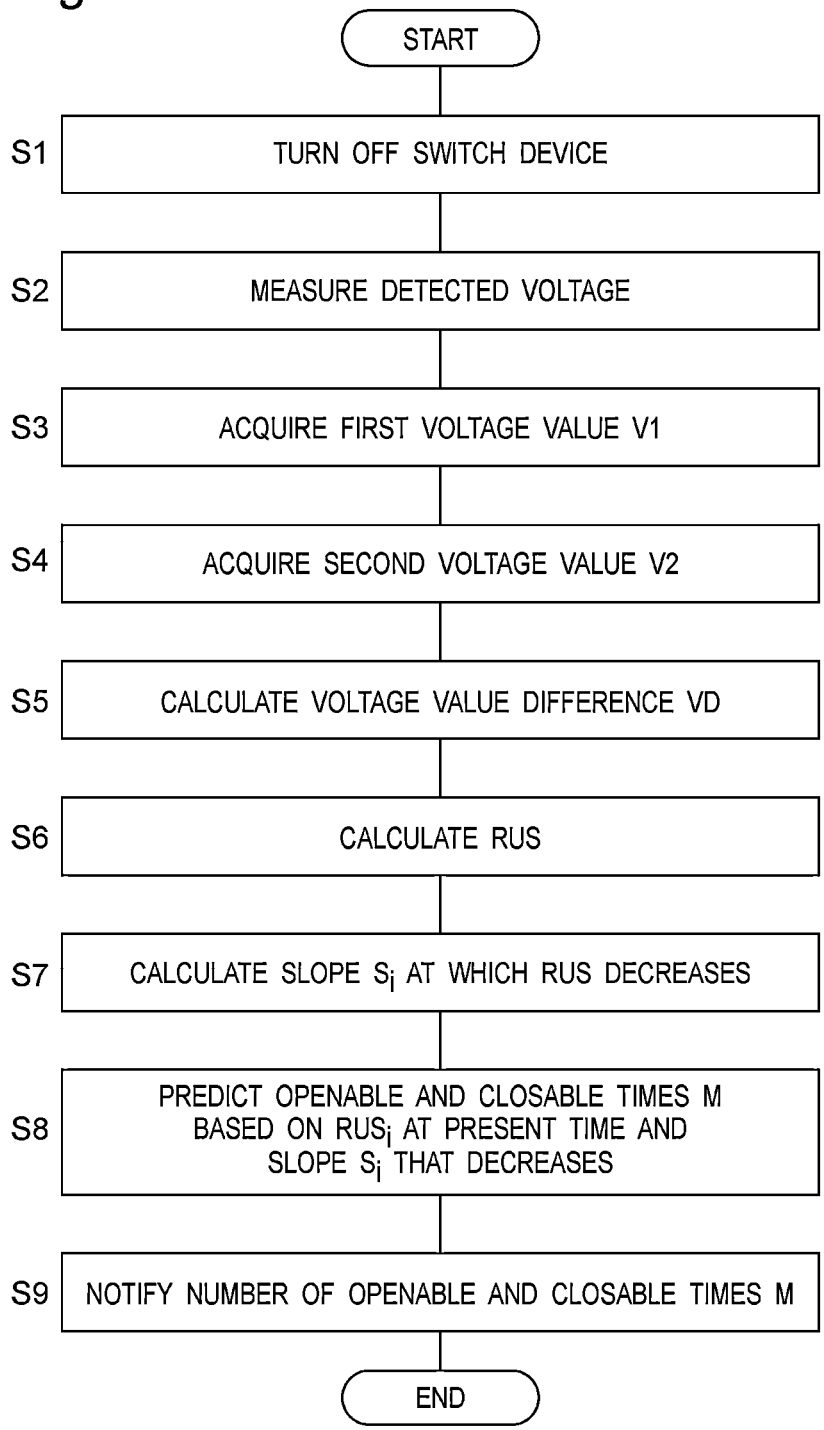
FIG. 3 is a flowchart explaining an operation of the relay state prediction system in FIG. 1.

Referring to FIG. 3, it is assumed that the switch device 2 is switched from the ON state to the OFF state (step S1). The switch device 2 notifies the relay state prediction device 10 of the switching. The signal reception unit 21 of the relay state prediction device 10 receives the notification.

Next, the voltmeter 8 measures a voltage between the two ends 9a and 9b of the shunt resistor 9 (step S2). The voltmeter 8 transmits a voltage value Va as the measurement result to the relay state prediction device 10, and the voltage value acquisition unit 22 of the relay state prediction device 10 receives the voltage value Va. The memory 25 stores the voltage value Va received by the voltage value acquisition unit 22. At this time, the voltmeter 8 is measuring every moment the voltage between the two ends 9a and 9b of the shunt resistor 9.

Figure 5:
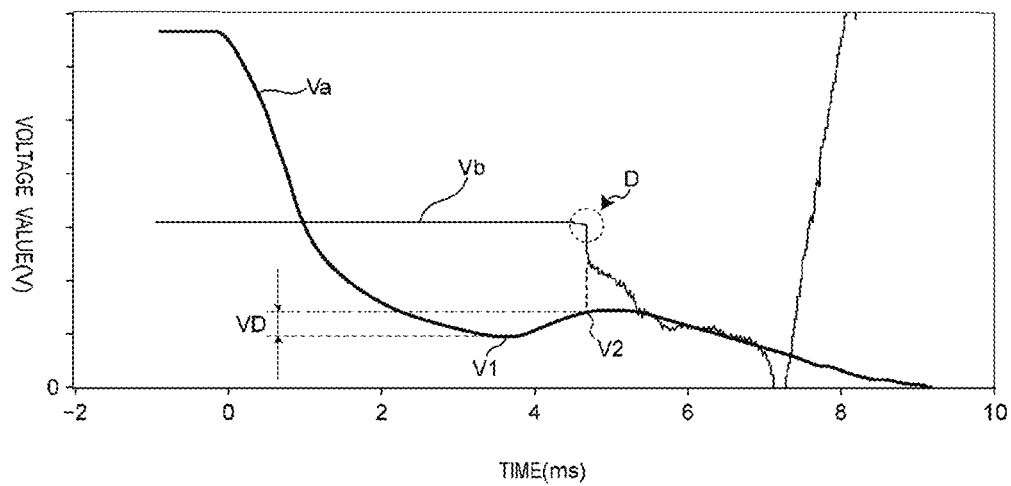
FIG. 5 is a diagram illustrating a voltage waveform.

Note that FIG. 5 illustrates time changes of the voltage value Va between the two ends 9a and 9b of the shunt resistor 9 and a voltage value Vb between the first contact 4b1 and the second contact 4b2 in the switch 4b, after the turn-off instruction to the relay 4 (after step S1 in FIG. 3). The vertical axis in FIG. 5 represents the voltage value (V), and the horizontal axis in FIG. 5 represents time (ms).

Next, the RUS calculation unit 28a of the relay state prediction device 10 acquires a voltage value V1 of when the voltage value Va decreases and becomes minimum by the armature 4A starting to be displaced in the direction indicated by the arrow X2 in FIG. 4B (step S3 in FIG. 3).

Next, the voltmeter 5 measures the voltage between the first contact 4b1 and the second contact 4b2 in the switch 4b. When the switch 4b is opened (as indicated by a dotted circle D in FIG. 5, which indicates the case in which the voltage value Vb suddenly decreases), the RUS calculation unit 28a of the relay state prediction device 10 acquires the voltage value Va measured by the voltmeter 8 as a second voltage value V2 (step S4 in FIG. 3).

Next, the RUS calculation unit 28a as the voltage value difference calculation unit of the relay state prediction device 10 calculates a voltage value difference VD between the voltage value V1 and the voltage value V2 (step S5).

Next, the RUS calculation unit 28a of the relay state prediction device 10 calculates the RUS by dividing the voltage value difference VD by a resistance value of the shunt resistor 9 (step S6). The memory 25 stores the RUS calculated by the RUS calculation unit 28a.

Next, the RUS calculation unit 28a transmits the RUS to the slope calculation unit 28b.

Now, FIG. 6 illustrates a relationship between the RUS and the number of opening and closing times of the contacts 4b1 and 4b2. The vertical axis in FIG. 6 is the RUS (μA), and the horizontal axis in FIG. 6 is the number of opening and closing times of the contacts 4b1 and 4b2. As illustrated in FIG. 6, it can be seen that the RUS decreases approximately to a linear function (a slope $S_i$ that decreases) as the number of opening and closing times increases.

Next, the slope calculation unit 28b receives the value of the RUS (this is referred to as $RUS_i$) every moment while the RUS decreases. Specifically, in this example, $RUS_i$ is received from the RUS calculation unit 28a, and then $RUS_{i-1}$ at the time of the previous turn (before the predetermined number of opening and closing times n) is received. By this, the slope $S_i = (RUS_i - RUS_{i-1})/n$ at which the RUS decreases in the present turn is obtained (step S7 in FIG. 3). In this manner, the slope calculation unit 28b obtains every moment the slope $S_i$ at which the RUS decreases while the RUS decreases. Note that the method of calculating the slope $S_i$ at which the RUS decreases is not limited thereto. The slope $S_i$ that decreases may be determined using the least squares method.

Next, the state prediction unit 28c reads out the threshold value Th stored in the threshold value storage unit 26. The state prediction unit 28c predicts the number of openable and closable times M until the RUS reaches the threshold value Th on the basis of the $RUS_i$ at the present time and the slope $S_i$ at which the RUS decreases (step S8 in FIG. 3). Specifically, as illustrated in FIG. 6, in this example, the threshold value is set to Th=100 μA. Therefore, by extrapolating the linear function based on the slope $S_i$ at which the RUS decreases from the $RUS_i$ at the present time, the number of openable and closable times M until the $RUS_i$ at the present time reaches the threshold value Th is obtained. Specifically, M is calculated by $M = (RUS_i - Th)/S_i$.

Note that, as can be seen from the above, the RUS used in the comparison processing in step S7 is the RUS obtained in step S6. The threshold value used in the comparison processing in step S7 is the threshold value Th preset in the threshold value storage unit 26 of the relay state prediction device 10.

Still further, the threshold value Th is set by the user on the basis of an empirical rule or the like. The user sets the threshold value Th on the basis of an empirical rule in consideration of the measurement result of the RUS illustrated in FIG. 6, the usage status of the relay 4, the expected time point of the failure of the relay 4 (the time point at which the opening and closing of the relay 4 is expected not to operate normally), and the like. In the example of FIG. 6, the threshold value Th is set to 100 μA. That is, in the example of FIG. 6, the user considers the above factors, and determines that the relay 4 has deteriorated when the RUS of the relay 4 to be used reaches 100 μA.

Next, in step S9 of FIG. 3, the state prediction unit 28c controls the notification unit 27, and the notification unit 27 notifies of the number of openable and closable times M of the relay 4 (step S9 of FIG. 3). Thereafter, the relay state prediction processing ends.

(Effects)

As described in the prior art, in the conventional relay, a technique for predicting the remaining life is not disclosed. On the other hand, in the present embodiment, it becomes possible to predict the number of openable and closable times from the present time until the RUS reaches a predetermined threshold value, that is, the remaining life of the relay.

FIG. 6 shows a certain test data exemplifying the relationship between the RUS of the relay and the number of opening and closing times of the relay. Samples #1 to #5 shown in FIG. 6 are relays of the same type (model number) and have been tested under the same conditions. As can be seen from the experimental example of FIG. 6, even in the relay of the same type (model number), the individual difference between the samples #1 to #5 is large regarding such as the RUS.

In consideration to this, in the present embodiment, the RUS calculation unit 28a calculates the RUS for the relay 4. Then, the state prediction unit 28c predicts the number of openable and closable times from the present time until the RUS reaches a predetermined threshold value. Here, it is empirically known that the individual difference of the relay 4 is small for the RUS when the relay 4 has deteriorated. Therefore, according to the present embodiment, the remaining life of the relay 4 can be accurately notified.

In addition, in the present embodiment, the notification unit 27 notifies of the number of openable and closable times from the present time until the RUS reaches a predetermined threshold value, that is, the remaining life. Therefore, the user can quickly take measures such as replacing the relay 4.

Software (computer program) for causing a computer to execute the relay state prediction method (FIG. 3) may be recorded in a recording medium that can store data in a non-transitory manner, such as a compact disc (CD), a digital versatile disc (DVD), or a flash memory. By installing the software recorded on the recording medium in an actual computer device such as a personal computer, a personal digital assistant (PDA), or a smartphone, the computer can be caused to execute the relay state prediction method described above.

In addition, in the above-described embodiment, the processor 28 includes a CPU, but the present invention is not limited thereto. The processor 28 may include a logic circuit (integrated circuit) such as a programmable logic device (PLD) or a field programmable gate array (FPGA).

As described above, a relay state prediction device of the present disclosure that predicts a number of openable and closable times until deterioration of a relay, the relay includes:
a primary-side switch, an operation coil, and a shunt resistor that are connected in series to a primary-side power supply;
a diode connected in parallel to a series connection of the operation coil and the shunt resistor in a direction in which current due to a counter electromotive force of the operation coil flows to the shunt resistor when the primary-side switch is turned off; and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount, the relay state prediction device comprises:
a voltage value acquisition unit that measures every moment a detected voltage detected from two ends of the shunt resistor;
a voltage value difference calculation unit that calculates a voltage value difference between a first voltage value of when the detected voltage becomes minimum by the armature starting displacement after the primary-side switch is turned off and a second voltage value of when the secondary-side contacts are opened;
a slope calculation unit that calculates a slope at which the voltage value difference decreases as the secondary-side contacts are repeatedly opened and closed in response to the primary-side switch repeatedly turning on and off; and
a state prediction unit that predicts the number of openable and closable times from a present time until the voltage value difference reaches a predetermined threshold value based on the voltage value difference at the present time and the slope that decreases.

In the relay state prediction device of the present disclosure, the voltage value acquisition unit measures every moment the detected voltage detected from two ends of the shunt resistor. The voltage value difference calculation unit calculates the voltage value difference between the first voltage value of when the detected voltage becomes minimum by the armature starting displacement after the primary-side switch is turned off and the second voltage value of when the secondary-side contacts are opened. The slope calculation unit calculates a slope at which the voltage value difference decreases as the secondary-side contacts are repeatedly opened and closed in response to the primary-side switch repeatedly turning on and off. The state prediction unit predicts the number of openable and closable times from the present time until the voltage value difference reaches a predetermined threshold value based on the voltage value difference at the present time and the decreasing slope. Note that it is known from experience that, in the relay, the voltage value difference decreases approximately to a linear function as the number of opening and closing times increases (that is, as the deterioration progresses). Therefore, it becomes possible to predict the number of openable and closable times from the present time until the voltage value difference reaches the predetermined threshold value, that is, the remaining life of the relay.

In the relay state prediction device of one embodiment, the slope calculation unit calculates a slope at which a current value obtained by dividing the voltage value difference by a value of the shunt resistor decreases.

In the present description, the phrase "the current value obtained by dividing the voltage value difference by the value of the shunt resistor, the voltage value difference being a value between the first voltage value of when the detected voltage becomes minimum by the armature starting displacement after the primary-side switch is turned off and the second voltage value of when the secondary-side contacts are opened" (this is referred to as "Reset Undershoot (RUS)"), is a value of current flowing through the operation coil in a period until the pressure pressing the secondary-side movable contact changes from a certain value to zero. This corresponds to the push-in amount of the armature, and the decrease in the push-in amount indicates that the armature is deteriorated.

In the relay state prediction device of the one embodiment, the slope calculation unit calculates the slope at which the current value obtained by dividing the voltage value difference by the value of the shunt resistor decreases. Therefore, the remaining life of the relay can be predicted based on the current value (that is, the RUS).

In the relay state prediction device of one embodiment, the relay state prediction device further comprises a notification unit that notifies of the number of openable and closable times that is predicted.

In the relay state prediction device of the one embodiment, a user can quantitatively recognize the remaining life until the relay deteriorates by receiving the notification. Therefore, the user can quickly take measures such as replacing the relay.

In another aspect, a relay state prediction system of the present disclosure comprises:
a relay that includes
a primary-side switch, an operation coil, and a shunt resistor that are connected in series to a primary-side power supply,
a diode connected in parallel to a series connection of the operation coil and the shunt resistor in a direction in which current due to a counter electromotive force of the operation coil flows to the shunt resistor when the primary-side switch is turned off, and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount;
a first voltmeter that measures a detected voltage detected from two ends of the shunt resistor;
a second voltmeter that measures a voltage between the pair of secondary-side contacts of the relay; and
a relay state prediction device communicably connected to the first voltmeter and the second voltmeter,
wherein the relay state prediction device includes:
a voltage value acquisition unit that measures every moment a detected voltage detected from the two ends of the shunt resistor;
a voltage value difference calculation unit that calculates a voltage value difference between a first voltage value of when the detected voltage becomes minimum by the armature starting displacement after the primary-side switch is turned off and a second voltage value of when the secondary-side contacts are opened;
a slope calculation unit that calculates a slope at which the voltage value difference decreases as the secondary-side contacts are repeatedly opened and closed in response to the primary-side switch repeatedly turning on and off; and
a state prediction unit that predicts a number of openable and closable times from a present time until the voltage value difference reaches a predetermined threshold value based on the voltage value difference at the present time and the slope that decreases.

In the relay state prediction system according to the present disclosure, the remaining life of the relay can be predicted.

In another aspect, a relay state prediction method of the present disclosure that predicts a number of openable and closable times until deterioration of a relay includes:
a primary-side switch, an operation coil, and a shunt resistor that are connected in series to a primary-side power supply;
a diode connected in parallel to a series connection of the operation coil and the shunt resistor in a direction in which current due to a counter electromotive force of the operation coil flows to the shunt resistor when the primary-side switch is turned off; and
an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount,
the relay state prediction method comprises:
measuring every moment a detected voltage detected from two ends of the shunt resistor;
calculating a voltage value difference between a first voltage value of when the detected voltage becomes minimum by the armature starting displacement after the primary-side switch is turned off and a second voltage value of when the secondary-side contacts are opened;
calculating a slope at which the voltage value difference decreases as the secondary-side contacts are repeatedly opened and closed in response to the primary-side switch repeatedly turning on and off; and
predicting the number of openable and closable times from a present time until the voltage value difference reaches a predetermined threshold value based on the voltage value difference at the present time and the slope that decreases.

In the relay state prediction method of the present disclosure, the remaining life of the relay can be predicted.

In yet another aspect, a non-transitory computer readable medium of the present disclosure is the non-transitory computer readable medium for causing a computer to execute the relay state prediction method.

The relay state prediction method can be performed by causing a computer to execute the non-transitory computer readable medium of the present disclosure.

The above embodiments are illustrative, and various modifications can be made without departing from the scope of the present invention. It is to be noted that the various embodiments described above can be appreciated individually within each embodiment, but the embodiments can be combined together. It is also to be noted that the various features in different embodiments can be appreciated individually by its own, but the features in different embodiments can be combined.

The invention claimed is:
1. A relay state prediction device that predicts a number of openable and closable times until deterioration of a relay, the relay including:
a primary-side switch, an operation coil, and a shunt resistor that are connected in series to a primary-side power supply;

a diode connected in parallel to a series connection of the operation coil and the shunt resistor in a direction in which current due to a counter electromotive force of the operation coil flows to the shunt resistor when the primary-side switch is turned off; and an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount, the relay state prediction device comprising:

a voltage value acquisition unit that measures every moment a detected voltage detected from two ends of the shunt resistor;

a voltage value difference calculation unit that calculates a voltage value difference between a first voltage value of when the detected voltage becomes minimum by the armature starting displacement after the primary-side switch is turned off and a second voltage value of when the secondary-side contacts are opened;

a slope calculation unit that calculates a slope at which the voltage value difference decreases as the secondary-side contacts are repeatedly opened and closed in response to the primary-side switch repeatedly turning on and off; and a state prediction unit that predicts the number of openable and closable times from a present time until the voltage value difference reaches a predetermined threshold value based on the voltage value difference at the present time and the slope that decreases.

2. The relay state prediction device according to claim 1, wherein the slope calculation unit calculates a slope at which a current value obtained by dividing the voltage value difference by a value of the shunt resistor decreases.

3. The relay state prediction device according to claim 1, further comprising a notification unit that notifies of the number of openable and closable times that is predicted.

4. A relay state prediction system comprising:

a relay that includes a primary-side switch, an operation coil, and a shunt resistor that are connected in series to a primary-side power supply, a diode connected in parallel to a series connection of the operation coil and the shunt resistor in a direction in which current due to a counter electromotive force of the operation coil flows to the shunt resistor when the primary-side switch is turned off, and an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount;

a first voltmeter that measures a detected voltage detected from two ends of the shunt resistor;

a second voltmeter that measures a voltage between a pair of secondary-side contacts of the relay; and a relay state prediction device communicably connected to the first voltmeter and the second voltmeter, wherein the relay state prediction device includes:

a voltage value acquisition unit that measures every moment a detected voltage detected from the two ends of the shunt resistor;

a voltage value difference calculation unit that calculates a voltage value difference between a first voltage value of when the detected voltage becomes minimum by the armature starting displacement after the primary-side switch is turned off and a second voltage value of when the secondary-side contacts are opened;

a slope calculation unit that calculates a slope at which the voltage value difference decreases as the secondary-side contacts are repeatedly opened and closed in response to the primary-side switch repeatedly turning on and off; and a state prediction unit that predicts a number of openable and closable times from a present time until the voltage value difference reaches a predetermined threshold value based on the voltage value difference at the present time and the slope that decreases.

5. A relay state prediction method that predicts a number of openable and closable times until deterioration of a relay including:

a primary-side switch, an operation coil, and a shunt resistor that are connected in series to a primary-side power supply;

a diode connected in parallel to a series connection of the operation coil and the shunt resistor in a direction in which current due to a counter electromotive force of the operation coil flows to the shunt resistor when the primary-side switch is turned off; and an armature that opens and closes at least a pair of secondary-side contacts in response to on and off of the primary-side switch, the armature being configured to be displaced relative to the operation coil by an electromagnetic force generated by the operation coil when the primary-side switch is turned on and to bring one of the secondary-side contacts into contact with an other of the secondary-side contacts while being deflected by a certain push-in amount, the relay state prediction method comprising:

measuring every moment a detected voltage detected from two ends of the shunt resistor;

calculating a voltage value difference between a first voltage value of when the detected voltage becomes minimum by the armature starting displacement after the primary-side switch is turned off and a second voltage value of when the secondary-side contacts are opened;

calculating a slope at which the voltage value difference decreases as the secondary-side contacts are repeatedly opened and closed in response to the primary-side switch repeatedly turning on and off; and predicting the number of openable and closable times from a present time until the voltage value difference reaches a predetermined threshold value based on the voltage value difference at the present time and the slope that decreases.

6. A non-transitory computer readable medium for causing a computer to execute the relay state prediction method according to claim 5.

* * * * *